(12) United States Patent
You

(10) Patent No.: US 8,399,958 B2
(45) Date of Patent: Mar. 19, 2013

(54) FUSE PART FOR SEMICONDUCTOR DEVICE

(75) Inventor: Byoung Hwa You, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 203 days.

(21) Appl. No.: 12/829,741

(22) Filed: Jul. 2, 2010

(65) Prior Publication Data

US 2011/0001213 A1 Jan. 6, 2011

(30) Foreign Application Priority Data

Jul. 3, 2009 (KR) .................. 10-2009-0060817

(51) Int. Cl.
*H01L 23/52* (2006.01)

(52) U.S. Cl. .............. 257/529; 438/132; 438/215

(58) Field of Classification Search .......... 257/529; 438/132, 215

See application file for complete search history.

(56) References Cited

U.S. PATENT DOCUMENTS 7,378,718 B2 * 5/2008 Tsutsui .................... 257/529
7,576,408 B2 * 8/2009 Byun et al. ............... 257/529

FOREIGN PATENT DOCUMENTS

KR 1020070052927 5/2007
KR 1020080002504 1/2008

OTHER PUBLICATIONS

Notice of Preliminary Rejection issued from Korean Intellectual Property Office on Dec. 28, 2010.

* cited by examiner

*Primary Examiner* — David Vu
*Assistant Examiner* — Brandon Fox
(74) *Attorney, Agent, or Firm* — IP & T Group LLP

(57) ABSTRACT

A fuse part for a semiconductor device includes an insulation layer configured to cover a conductive pattern over a substrate, a dual fuse configured to include a first pattern and a second pattern that are positioned on the same line over the insulation layer and spaced apart from each other by a certain distance, a protective layer configured to cover the dual fuse and include a first fuse box and a second fuse box that partially expose the first pattern and the second pattern, respectively, and a plurality of plugs configured to penetrate the insulation layer and electrically connect the first and second patterns to the conductive pattern. Herein, the plugs are positioned beneath the first and second fuse boxes.

8 Claims, 4 Drawing Sheets

FUSE PART FOR SEMICONDUCTOR DEVICE

CROSS-REFERENCE TO RELATED APPLICATIONS

The present application claims priority of Korean Patent Application No. 10-2009-0060817, filed on Jul. 3, 2009, which is incorporated herein by reference in its entirety.

BACKGROUND OF THE INVENTION

Exemplary embodiments of the present invention relate to a technology for fabricating a semiconductor device, and more particularly, to a fuse part for a semiconductor device employing a dual fuse.

If there is a failure in any one amongst the innumerable cells of a semiconductor memory device, the semiconductor memory device does not function and may be regarded as a defective product. Discarding the semiconductor memory device as a whole is quite ineffective in terms of production yield because the defect may have only occurred in some cells inside the semiconductor memory device. Therefore, the industry seeks to improve the production yield by preparing redundancy cells inside the semiconductor memory device in order to replace defective cells. This process is referred to as a repair process, and through the repair process, the whole semiconductor memory device is resuscitated.

A semiconductor device includes a fuse part for performing the above-described repair process. Typically, a fuse part includes a fuse and a fuse box, which is formed in a protective layer covering the fuse and allows access to a portion of the fuse. The fuse may be formed as a single fuse, which is formed of a single pattern according to the characteristics required by the semiconductor device or the fuse may be formed as a dual fuse, which is formed of a plurality of patterns spaced apart from each other on the same line by a predetermined distance.

FIGS. 1A and 1B illustrate a conventional fuse part of a semiconductor device employing a dual fuse according to prior art.

FIG. 1A is a plan view of the fuse part of the semiconductor device, and FIG. 1B is a cross-sectional view of the fuse part shown in FIG. 1A along a line X-X'. FIG. 2 is a photograph showing a concern with the conventional technology.

Referring to FIGS. 1A and 1B, the conventional fuse part of the semiconductor device includes a substrate 11, a dual fuse 14, a conductive pattern 12, a plurality of plugs 13, an insulation layer 15, a protective layer 16, a first fuse box 17A, and a second fuse box 17B. The dual fuse 14 includes a first pattern 14A and a second pattern 14B positioned to be spaced apart on the same line by a predetermined distance. The conductive pattern 12 is formed below the dual fuse 14. The plurality of the plugs 13 electrically connect the dual fuse 14 with the conductive pattern 12. The insulation layer 15 fills the space between the conductive pattern 12 and the dual fuse 14 and between the plugs 13. The protective layer 16 covers the dual fuse 14. The first and second fuse boxes 17A and 17B are formed in the protective layer 16 to partially expose the first and second patterns 14A and 14B, respectively.

One concern with the conventional fuse part is that its fuse box 17 may crack. It seems that the bottom surface of the fuse box 17 may crack as a result of stress that is concentrated at the edges of a bottom surface of the fuse box 17 due to the sharp edges of the bottom surface of the fuse box 17. Further, when a crack forms at the edges of the bottom surface of the fuse box 17 it may electrically disconnect the plugs 13, which electrically connect the first and second patterns 14A and 14B to the conductive pattern 12 (see reference symbol 'A' of FIG. 1B and FIG. 2). Thus, a repair fuse defect may occur because the dual fuse 14 which is not cut (i.e., a non-repair fuse) is recognized as a disconnected dual fuse 14 (i.e., a repair fuse).

As the integration degree of a semiconductor device increases and the size of the fuse part decreases, concern about the existence of a crack grows. Further, a crack is even more likely to occur due to a filler layer 18 filling the fuse box 17 during a package process. This is because as the size of the fuse part decreases, stress is more concentrated at the edges of the bottom surface of the fuse box 17, and the filler layer 18 increases the stress applied to the bottom surface of the fuse box 17.

SUMMARY OF THE INVENTION

Exemplary embodiments of the present invention are directed to a fuse part for a semiconductor device that can prevent a fuse defect originating from a crack in a semiconductor device employing a dual fuse.

In accordance with an exemplary embodiment of the present invention, a fuse part for a semiconductor device includes an insulation layer configured to cover a conductive pattern over a substrate, a dual fuse configured to include a first pattern and a second pattern that are positioned on the same line over the insulation layer and spaced apart from each other by a certain distance, a protective layer configured to cover the dual fuse and include a first fuse box and a second fuse box that partially expose the first pattern and the second pattern, respectively, and a plurality of plugs configured to penetrate the insulation layer and electrically connect the first and second patterns to the conductive pattern. Herein, the plugs are positioned beneath the first and second fuse boxes.

The fuse part may further include at least one additional plug positioned below the protective layer between the first fuse box and the second fuse box.

The thickness of the first and second patterns exposed by the first and second fuse boxes may be thinner than the thickness of the first and second patterns not exposed by the first and second fuse boxes.

The conductive pattern may include a bit line or a metal line, and the dual fuse may include a metal line.

The fuse part may further include a filler layer configured to fill the first and second fuse boxes. The filler layer may include an epoxy mold compound (EMC).

In accordance with another exemplary embodiment of the present invention, a method for fabricating a fuse part includes forming a conductive pattern over a substrate, forming an insulation layer over the conductive pattern, forming a dual fuse, including a first pattern and a second pattern that are positioned on the same line and spaced apart from each other by a certain distance, over the insulation layer, forming a protective layer over the dual fuse to define a first fuse box and a second fuse box that partially expose the first pattern and the second pattern, respectively, and forming a plurality of plugs configured to penetrate the insulation layer and electrically connect the first and second patterns to the conductive pattern, wherein the plugs are positioned beneath the first and second fuse boxes.

DESCRIPTION OF SPECIFIC EMBODIMENTS

Figure 1A:
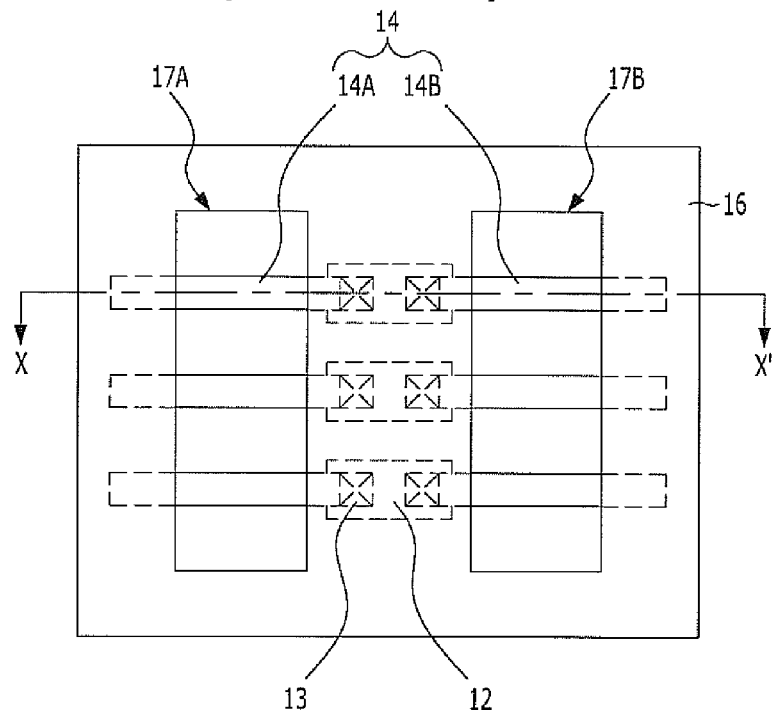
FIGS. 1A and 1B illustrate a conventional fuse part of a semiconductor device employing a dual fuse according to prior art.
Figure 1B:
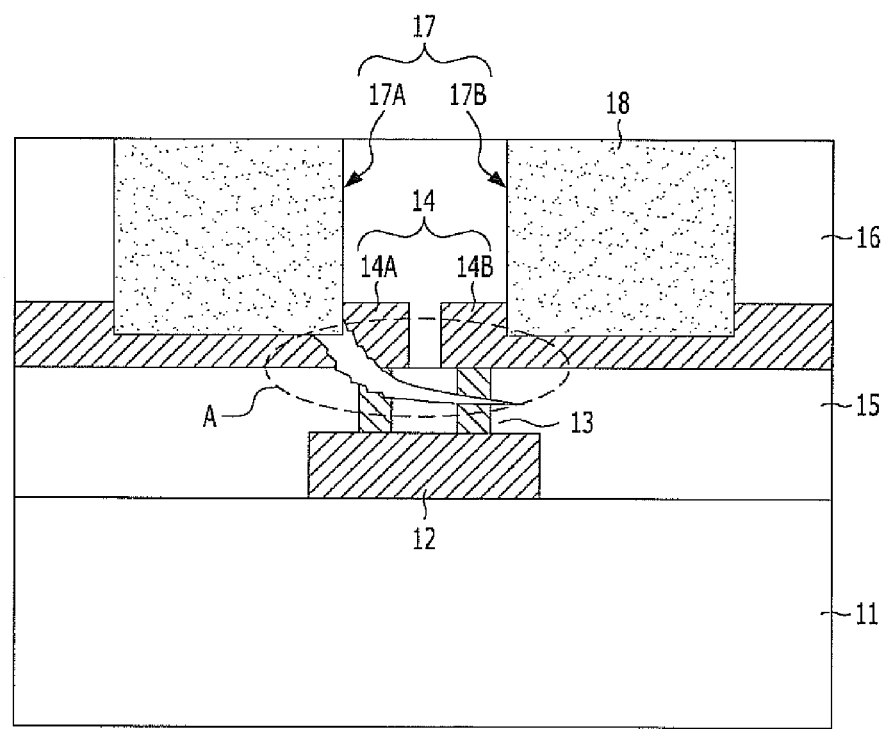
Figure 2:
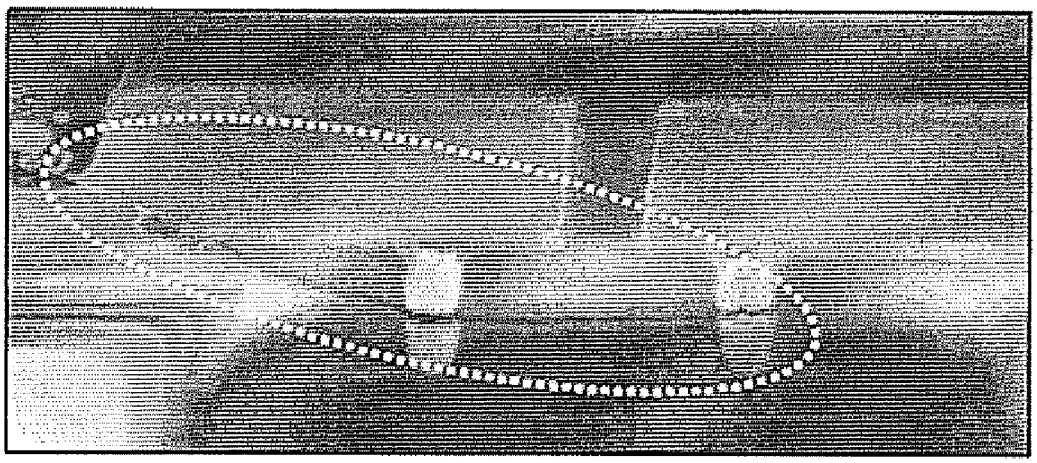
FIG. 2 is a photograph showing a concern with the conventional technology.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

The embodiments of the present invention to be described hereafter provide a fuse part for a semiconductor device that can prevent a repair fuse defect originating from a crack in a semiconductor device employing a dual fuse. To this end, plugs for electrically connecting a dual fuse and a conductive pattern under the dual fuse are positioned beneath a fuse box.

Figure 3A:
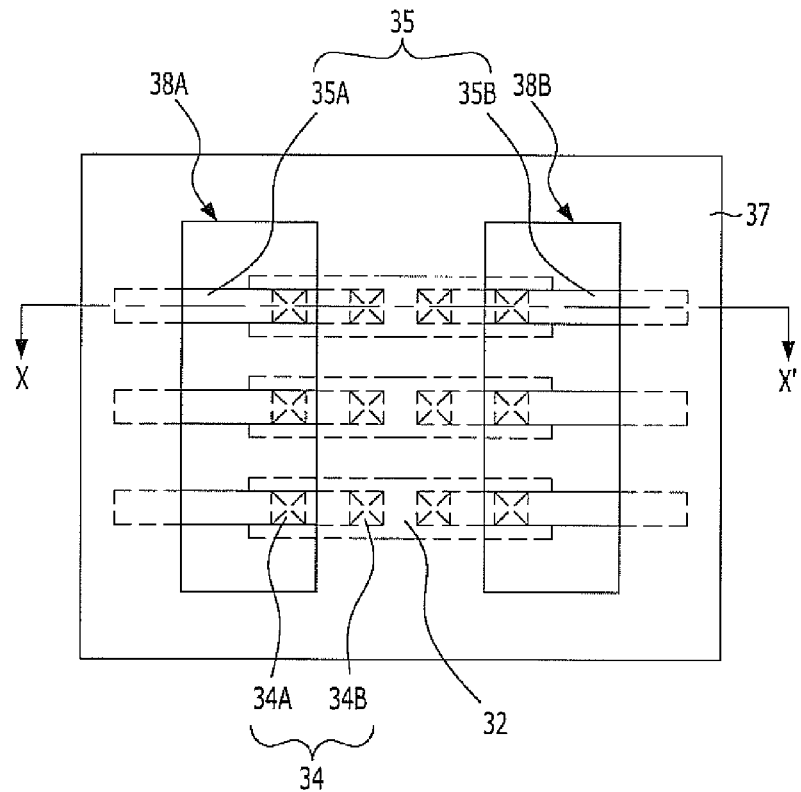
FIGS. 3A and 3B illustrate a fuse part of a semiconductor device in accordance with an exemplary embodiment of the present invention.
Figure 3B:
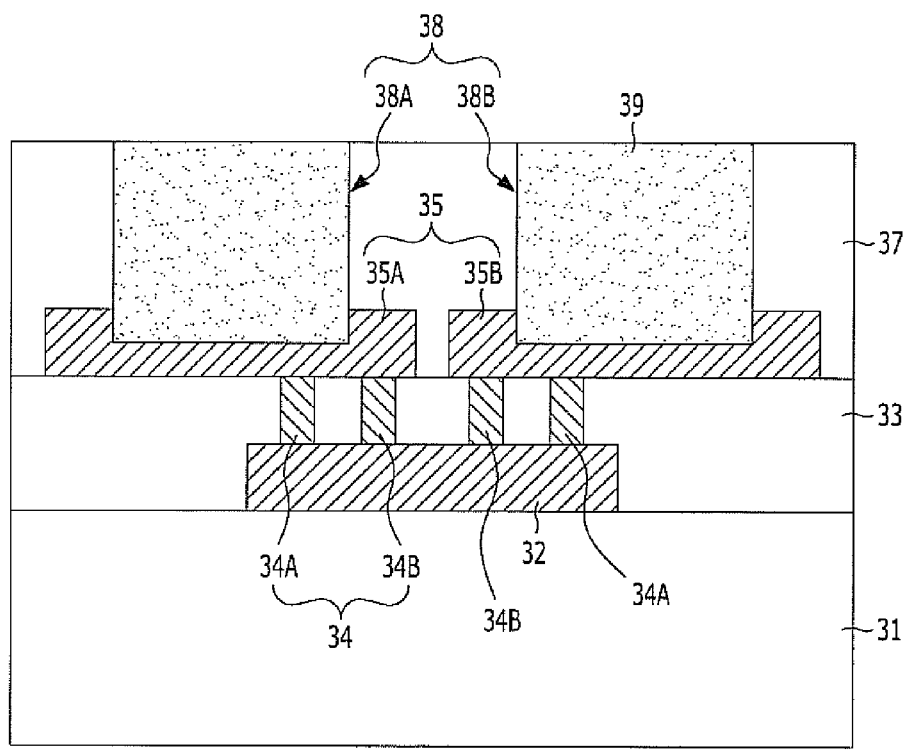

FIGS. 3A and 3B illustrate a fuse part for a semiconductor device in accordance with an exemplary embodiment of the present invention. FIG. 3A is a plan view of the fuse part, and FIG. 3B is a cross-sectional view of the fuse part of FIG. 3A along a line X-X'.

Referring to FIGS. 3A and 3B, the fuse part includes a conductive pattern 32, an insulation layer 33, a dual fuse 35, a protective layer 37, and a plurality of plugs 34. The conductive pattern 32 is formed over a substrate 31. The insulation layer 33 covers a conductive pattern 32 over the substrate 31. The dual fuse 35 includes a first pattern 35A and a second pattern 35B which are positioned on the same line above the insulation layer 33 and spaced apart from each other by a certain distance. The protective layer 37 covers the dual fuse 35 and includes a first fuse box 38A and a second fuse box 38B that partially expose the first pattern 35A and the second pattern 35B, respectively. The plurality of plugs 34 penetrate the insulation layer 33 and electrically connect the conductive pattern 32 to the dual fuse 35. Herein, the plugs 34 are positioned in below the first and second fuse boxes 38A and 38B.

To be more specific, the plugs 34 may include only first plugs 34A positioned beneath the first and second fuse boxes 38A and 38B, or the plugs 34 may include first plugs 34A positioned beneath the first and second fuse boxes 38A and 38B and second plugs 34B positioned below the protective layer 37 between the first fuse box 38A and the second fuse box 3813. Herein, the first plugs 34A positioned beneath the first and second fuse boxes 38A and 38B are placed below the first and second fuse boxes 38A and 3813 and between the sidewalls of the first fuse box 38A or between the sidewalls of the second fuse box 38B. Therefore, even if the edges of the bottom surfaces of the fuse boxes 38A and 38B crack, the first plugs 34A are not electrically disconnected by the crack (see FIG. 4).

The dual fuse 35 formed of the first pattern 35A and the second pattern 35B may be a metal line. To be specific, a metal line of a triple-layer-of-metal (TLM) structure (i.e., a first, second, or third metal line) may be extended to the fuse part to form the dual fuse 35.

Also, in the first and second patterns 35A and 35B, the thickness of a region exposed by the first and second fuse boxes 38A and 38B may be thinner than the thickness of a region not exposed by the first and second fuse boxes 38A and 38B. In other words, a thickness of portions of the first and second patterns 35A and 35B that are exposed by the first and second fuse boxes 38A and 3813 may be thinner than a thickness of portions of the first and second patterns 35A and 35B that are not exposed by the first and second fuse boxes 38A and 38B. This allows the dual fuse 35 to be electrically disconnected with a small amount of energy during a repair process.

The conductive pattern 32 formed below the dual fuse 35 may be a bit line or a metal line (e.g., a first, second, or third metal line of a TLM structure). Therefore, for example, when the conductive pattern 32 is a bit line, the dual fuse 35 may be the first metal line of a TLM structure. In another example, when the conductive pattern 32 is the first metal line of a TLM structure, the dual fuse 35 may be the second metal line of the TLM structure.

The insulation layer 33 may include an oxide layer, and the protective layer 37 may be a single layer selected from the group consisting of an oxide layer, a nitride layer, an oxynitride layer, an amorphous carbon layer (ACL), and a polyimide layer, or a multi-layer where two or more of these layers are stacked.

Also, the fuse part of the embodiment of the present invention may further include a filler layer 39 filling the first and second fuse boxes 38A and 38B. Herein, the filler layer 39 protects the dual fuse 35 from being damaged, particularly, being oxidized or corroded. The filler layer 39 may be formed of epoxy mold compound (EMC). EMC is a material usually used for encapsulating a chip during a package process. Here, the EMC may be a mixture of approximately 30 kinds of diverse materials based on an epoxy-based resin and a silica-based filler.

The fuse part having the above-described structure can prevent a repair fuse defect originating from a crack by utilizing the first plugs 34A positioned beneath the first and second fuse boxes 38A and 38B. This will be described in detail with reference to FIG. 4.

Figure 4:
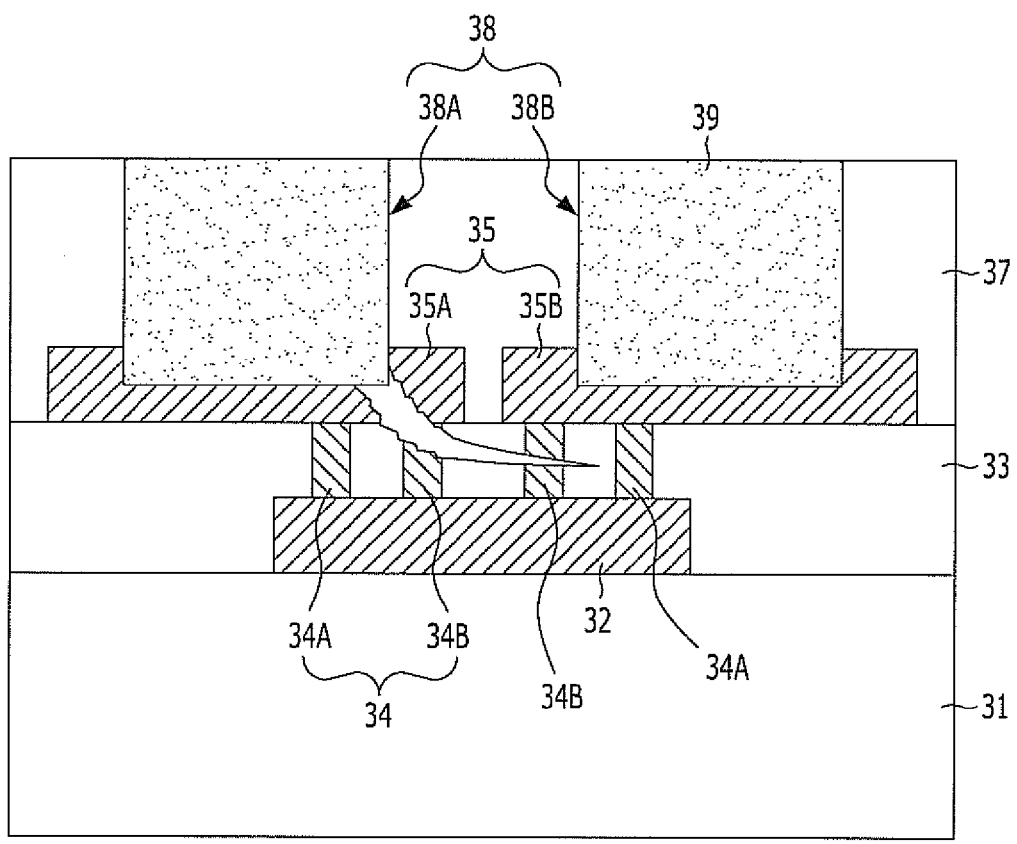
FIG. 4 is a cross-sectional view illustrating a crack occurring in the fuse part of the semiconductor device in accordance with an exemplary embodiment of the present invention.

FIG. 4 is a cross-sectional view illustrating a crack occurring in the fuse part for the semiconductor device in accordance with an exemplary embodiment of the present invention.

Referring to FIG. 4, it can be seen that the edges of the bottom surfaces of the fuse boxes 38 may crack due to the sharp shape of the edges of the bottom surfaces of the fuse boxes 38, a decreased size of the fuse part, and the stress of the filler layer 39. As shown, a crack may originate at an edge of the bottom surface of the fuse boxes 38, and extend down into the semiconductor device through the dual fuse 35 (see FIG. 4).

However, although the second plug 34B positioned below the protective layer 37 between the first fuse box 38A and the second fuse box 38B is electrically disconnected due to the crack, the fuse part of the semiconductor device in accordance with an exemplary embodiment of the present invention can operate normally through the first plugs 34A, which are positioned beneath the first and second fuse boxes 38A and 38B.

To be more specific, because the first plugs 34A are positioned beneath the first and second fuse boxes 38A and 38B, even when the edges of the fuse boxes 38 crack, the first plugs 34A are not electrically disconnected by the crack. This is because the crack occurring at the edges of the bottom surfaces of the fuse boxes 38 generally extends down on an angle into a region that is not beneath the fuse boxes 38.

With the first plugs 34A providing an electrical connection from the dual fuse 35 to the conductive pattern 32, it is possible to prevent a repair fuse defect where the dual fuse 35, which is not electrically disconnected (i.e., a non-repair fuse), is recognized as a dual fuse 35, which is electrically disconnected (i.e., a repair fuse).

According to the technology of the present invention, the plugs electrically connecting the dual fuse 35 to the conductive pattern 32 are positioned beneath the first and second fuse boxes 38A and 38B. Thus, although the edges of the bottom surfaces of the first and second fuse boxes 38A and 38B may crack, it is possible to prevent the plugs 34 from being electrically disconnected by the crack.

Therefore, the technology of the present invention can prevent a repair fuse defect caused by a crack from occurring, and thereby improve the reliability of a semiconductor device.

While the present invention has been described with respect to the specific embodiments, it will be apparent to those skilled in the art that various changes and modifications may be made without departing from the spirit and scope of the invention as defined in the following claims.

What is claimed is:

1. A fuse part for a semiconductor device, the fuse part comprising:
   an insulation layer configured to cover a conductive pattern over a substrate;
   a dual fuse configured to include a first pattern and a second pattern that are positioned on the same line over the insulation layer and spaced apart from each other by a certain distance;
   a protective layer configured to cover the dual fuse;
   a first fuse box and a second fuse box, formed in the protective layer, configured to partially expose top surfaces of the first pattern and the second pattern, respectively; and
   a plurality of plugs configured to penetrate the insulation layer and electrically connect the first and second patterns to the conductive pattern,
   wherein the plugs are positioned beneath the first and second fuse boxes.

2. The fuse part of claim 1, further comprising at least one additional plug positioned below the protective layer between the first fuse box and the second fuse box.

3. The fuse part of claim 1, wherein a thickness of a portion of the first pattern that is to be exposed by the first fuse box is thinner than a thickness of a portion of the first pattern that is not to be exposed by the first fuse box and wherein, a thickness of a portion of the second pattern that is to be exposed by the second fuse box is thinner than a thickness of a portion of the second pattern that is not to be exposed by the second fuse box.

4. The fuse part of claim 1, wherein the conductive pattern includes a bit line or a metal line.

5. The fuse part of claim 1, wherein the dual fuse includes a metal line.

6. The fuse part of claim 1, further comprising:
   a filler layer configured to fill the first and second fuse boxes.

7. The fuse part of claim 6, wherein the filler layer includes an epoxy mold compound (EMC).

8. A method of fabricating a fuse part for a semiconductor device, the method comprising:
   forming a conductive pattern over a substrate;
   forming an insulation layer over the conductive pattern;
   forming a dual fuse over the insulation layer, the dual fuse including a first pattern and a second pattern that are spaced apart from each other by a certain distance;
   forming a protective layer over the dual fuse;
   forming a first fuse box and a second fuse box in the protective layer, to partially expose top surface of the first pattern and the second pattern, respectively; and
   forming a plurality of plugs configured to penetrate the insulation layer and to electrically connect the first pattern and the second pattern to the conductive pattern,
   wherein each of the plurality of plugs is positioned beneath the first fuse box and the second fuse box.

* * * * *